United States Patent [19]

Orii

[11] 4,104,593

[45] Aug. 1, 1978

[54] RECEIVER CIRCUIT INCLUDING AN HYSTERESIS CIRCUIT FOR USE WITH A REMOTE CONTROLLER

[75] Inventor: Toshio Orii, Daito, Japan

[73] Assignee: Sanyo Electric Co., Ltd., Osaka, Japan

[21] Appl. No.: 736,369

[22] Filed: Oct. 28, 1976

[30] Foreign Application Priority Data

Oct. 28, 1975 [JP] Japan .................... 50-147539[U]

[51] Int. Cl.² .............................................. H04B 1/16
[52] U.S. Cl. .................... 325/392; 343/228; 307/360
[58] Field of Search ............ 325/37, 390, 391–394; 358/194; 343/225, 228; 307/247 R, 360, 363, 290, 291

[56] References Cited

U.S. PATENT DOCUMENTS

| 3,027,497 | 3/1962 | Carlson et al. ................. 325/392 |
| 3,537,012 | 10/1970 | Reichard et al. ................. 325/391 |
| 3,683,284 | 8/1972 | Mueller ................. 307/360 |
| 3,700,921 | 10/1972 | Gay ................. 307/360 |
| 3,760,282 | 9/1973 | Arnold et al. ................. 307/360 |

*Primary Examiner*—Robert L. Griffin
*Assistant Examiner*—Jin F. Ng
*Attorney, Agent, or Firm*—Armstrong, Nikaido, Marmelstein & Kubovcik

[57] ABSTRACT

The present disclosure relates to a receiver unit for remote controller to be employed in telecommunication apparatuses such as television sets, in which the tuning devices such as channel selecting system and/or volume for loudness can be controlled through manipulation of transmitter separately provided for the television set. The receiver unit incorporated in the television set includes a hysteresis circuit which generates a signal having two distinctive states upon receipt of fluctuating signal from the transmitter, so as to stabilize the operation of the operator in the receiver unit during the actuation thereof.

14 Claims, 6 Drawing Figures

RECEIVER CIRCUIT INCLUDING AN HYSTERESIS CIRCUIT FOR USE WITH A REMOTE CONTROLLER

BACKGROUND OF THE INVENTION

The present invention relates to a remote controller, for use in electric or electronic appliances and telecommunication devices such as television sets. More particularly, the present invention relates to an electronic circuit for a remote controller receiver unit which is capable of controlling operations of a television receiving set such as turning on or off of a main switch, switching-over of a tuner unit for channel selection or turning a volume control for loudness adjustments.

Conventionally, in the remote controller of the above described type, the receiver usually includes, as shown in FIG. 1, a microphone for receiving sound signal of high frequency, for example ultra-sonic waves of approximately 20 KHz from a transmitter, and for converting such sound signal into electrical signal, an amplifier for amplifying the electrical signal, and a frequency modulation detector (referred to as FM detector hereinbelow) for detecting particular FM signal. The detected signal is generally distributed into numbers of series networks for operating particular tuning devices coupled to respective series networks by an operator circuit connected at the end of each series network. The tuning devices to be operated are, for example, device for turning on the television set, device for changing the volume of the loudness, device for switching-over the channel in the television set, etc. In the known arrangement of FIG. 1, the detected signal is distributed into two channels, in which the first channel is capable for receiving electrical signal in particular frequency such as 380 Hz, and the second channel is capable for receiving electrical signal in another particular frequency such as 280 Hz. The first channel includes a filter for filtering the signal having the frequency of 380 Hz, a relay driver for actuating a relay connected to the relay driver upon receipt of the signal from the filter, the relay, and the operator which operates the particular device coupled thereto.

The arrangement for the second channel is similar to those for the first channel, but the difference is that the filter in the second channel is designed to filter the signal having the frequency of 280 Hz.

In order to operate the receiver, the one who operates must have his transmitter aimed at the receiver, especially at the microphone, during the emission of sound signals in high frequency from the transmitter.

However, it has been found that the sound signal produced from the transmitter may deteriorate the operation of the receiver when the properly aimed sound signal changes the course to deviate from the microphone, or when the deviated sound signal changes the course to come into properly aimed position due to shaking or moving around the transmitter by the one who operates during the manipulation thereof.

Such change in the course causes fluctuations in the amplitude of the received sound signal in the microphone and in turn results in fluctuations in the input electrical signal to the FM detector, so that the FM detector may not function properly, especially when the input electrical signal is decreased below the limit level for the FM detector, to produce the proper electrical signal therefrom. Therefore, the transistors incorporated in the relay driver may fail to function in a proper manner, such that the signal produced from the relay driver may cause fluctuations in the operation of the transistors quite rapidly between conducted and non-conducted state, thus resulting in the undesirable intermittent closure of open contacts or opening of closed contacts in the relay, i.e., the so-called relay contact chattering.

SUMMARY OF THE INVENTION

Accordingly, a primary object of the present invention is to provide an improved type of a receiver unit in which the relay incorporated therein operates in a stable condition in spite of fluctuation in the received sound signal.

A further object of the present invention is to provide the above described type of receiver unit in which the noise in the signal to be supplied to the operator circuit is reduced.

A still further object of the present invention is to present the above described type of receiver unit which can be formed into a single integrated circuit.

The foregoing objects and others are accomplished in accordance with this invention by introducing, after the filter circuit, a circuit means which changes its output signal in two distinctive states, i.e., the high and the low states, in accordance with gradual change in the input signal. More particularly, during the increase of the input signal to the circuit means, the output signal therefrom is maintained in low state until the input signal thereto increases upto comparatively high state. On the other hand, during the decrease of the input signal in the circuit means, the output signal therefrom is maintained in high state until the input signal thereto decreases to comparatively low state. For the purpose of the present disclosure, above described type of circuit means is referred to as hysteresis circuit, because the characteristics of the output signal with respect to the input signal is similar to hysteresis loop.

The hysteresis circuit comprises first and second voltage detector circuits capable of detecting high and low input signals supplied to the hysteresis circuit, respectively, and a set of flip-flop circuits connected to the first and second voltage detector circuits for producing two distinctive types of output signals therefrom.

When the output signal from the hysteresis circuit is once turned into the high state, such high state is maintained until the input signal thereto becomes comparatively low, and on the other hand when the output signal is once turned into the low state, such low state is maintained until the input signal becomes comparatively high. Therefore, the fluctuation in the input signal will not disadvantageously change the output signal from low to high or high to low state as in the conventional type of receiver units.

BRIEF DESCRIPTION OF THE DRAWINGS

These and other objects and features of the present invention will become apparent from the following description taken in conjunction with a preferred embodiment thereof with reference to the accompanying drawings, wherein;

FIG. 1 is a block diagram of the receiver unit of the prior art which has already been referred to;

DETAILED DESCRIPTION OF THE PREFERRED EMBODIMENT

Figure 1:
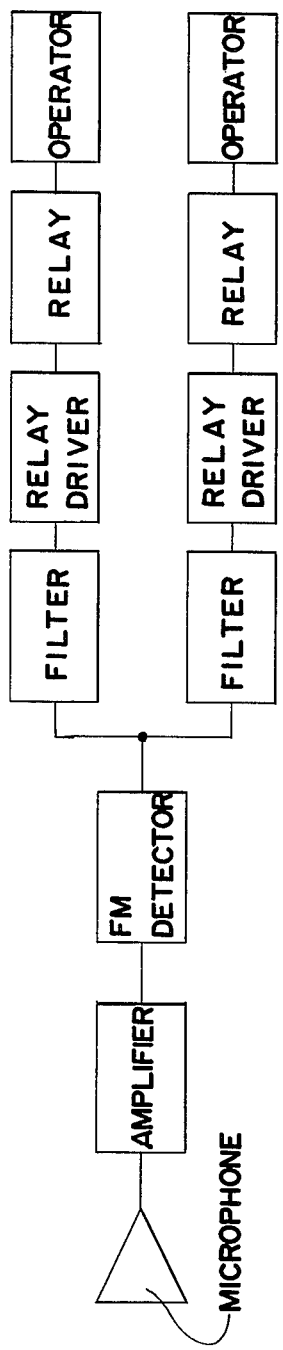
Figure 2:
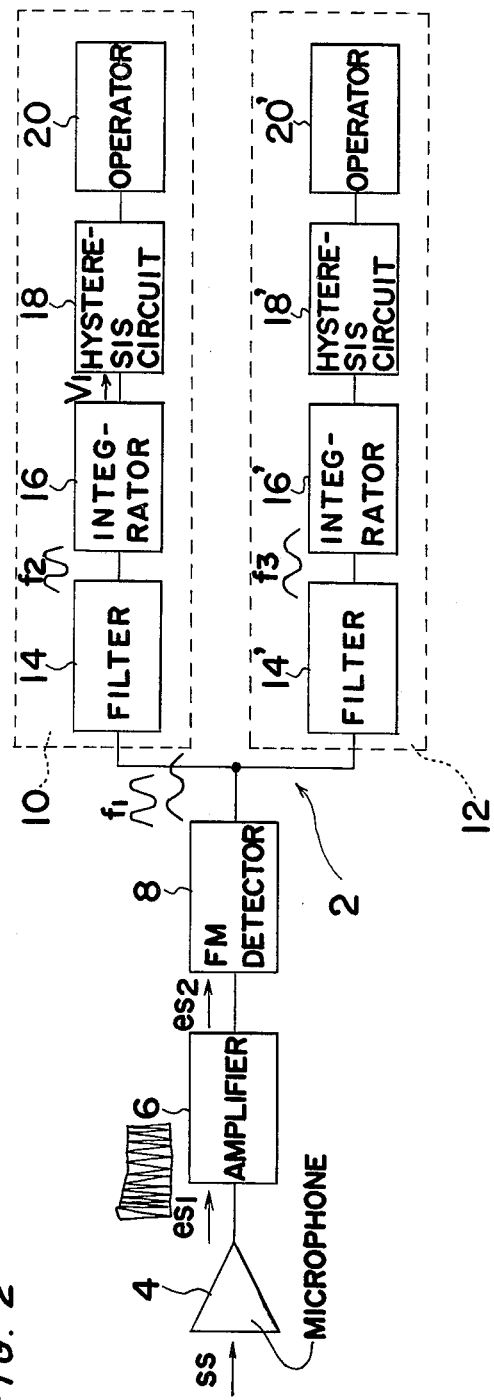
FIG. 2 is a block diagram of the improved type of receiver unit of the present invention.

Referring to FIG. 2, a receiver unit 2 of the present invention is incorporated in a television set (not shown) and is designed to actuate "ON" and "OFF" switch therefor as well as the volume for the loudness and to actuate channel selecting system to change the channel in desired station, upon receipt of signal from a transmitter (not shown) which is manipulated by one who is operating it. The transmitter has two actuators such as two buttons and is designed to produce, upon pressing down either one of the button, a transmissive carrying remote control signal in a form of, for example, sound signal which carries particular control signal depending on the pressed button. The first button may be so arranged to produce sound signal effective on the "ON" and "OFF" switch and the volume for the loudness, while the second button may be so arranged to produce sound signal effective on the channel selecting system. The receiver unit 2 of the present invention comprises a microphone 4 for receiving sound signal $ss$ in high frequency, for example, in about 20 KHz produced from the transmitter and for converting the received sound signal $ss$ into electrical signal $es1$, an amplifier 6 connected to the microphone 4 for amplifying the electrical signal $es1$ into an electrical signal $es2$ and an FM detector 8 connected to the amplifier 6 for detecting a particular electrical signal $f1$ in the electrical signal $es2$. Although the electrical signal $es2$ may have the frequency of about 20 KHz, the particular electrical signal $f1$ may have, for example, the frequency of several hundred hertzs converted through a process of demodulation. The electrical signal $f1$ may consist of numbers of different electrical signals each having different frequencies. For the purpose of the present disclosure, the electrical signal $f1$ in the present case, has either one or both of two different electrical signals $f2$ and $f3$, each having frequency of, for example 380 Hz and 280 Hz, respectively.

It should be noted that the peak values of those signals $f2$ and $f3$ may fluctuate in relation to the shake occurring in the transmitter during the manipulation thereof.

The receiver unit 2 of the present invention further comprises a first series network 10 having a filter 14, integrator 16, hysteresis circuit 18 and operator 20 which are connected in series in listed order, and a second series network 12 having the same circuit as the first series network 10, namely the filter 14', integrator 16', hysteresis circuit 18' and operator 20'.

In the first series network 10, the filter 14 separates the signal $f2$ from the signal $f1$, and the integrator 16 integrates the signal $f2$ and generates a signal V1, so that the signal $f2$ having the feature of A.C. power is inverted into signal V1 having the feature D.C. power. In the hysteresis circuit 18, the fluctuating D.C. signal V1 is determined whether it should be classified in high or low signal and produces stable high signal when the input signal V1 thereto should belong to high signal and stable low signal when the input signal thereto belongs to low signal, the manner of which is described in detail later. The high signal from the hysteresis circuit 18 is applied on the operator 20 to function one of the various electrical units, such as a switch for turning on the television set or a pulse generator for actuating the channel selecting system.

The function in the second series network 12 is similar to those in the first series network 10. The mere difference is that the filter 14' separates the signal $f3$, instead of signal $f2$, from the signal $f1$, and that the system for the operator 20' may be different, due to difference in the type of electrical units connected thereto.

Figure 3:
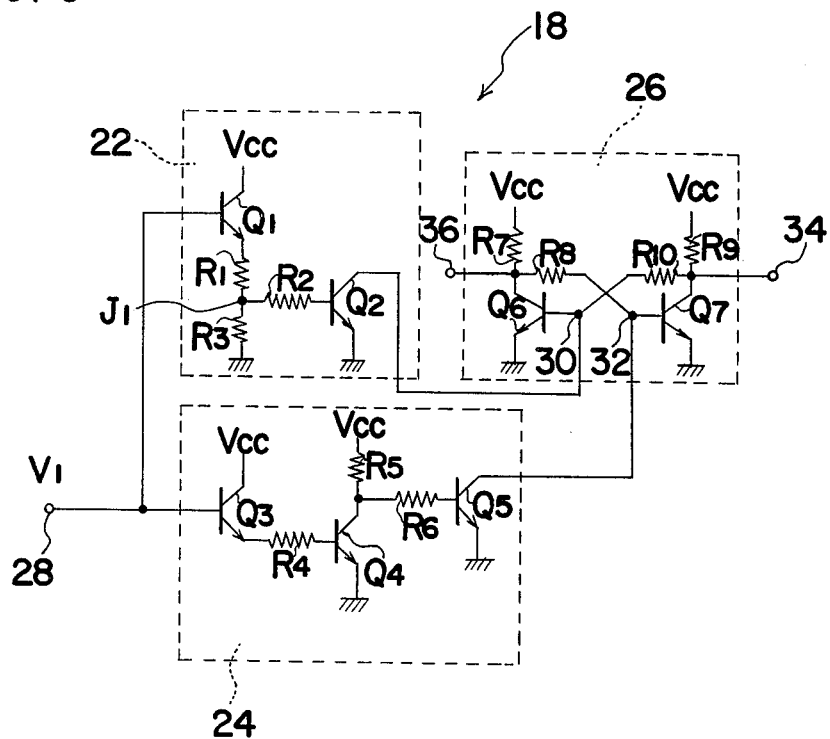
FIG. 3 is an electric circuit diagram showing connection for the hysteresis circuit for the receiver shown in FIG. 2.

Referring to FIG. 3, the hysteresis circuit 18 comprises a second voltage detecting circuit 22, a first voltage detecting circuit 24 and a flip-flop circuit 26.

The second voltage detecting circuit 22 comprises a transistor Q1 having the base connected to an input terminal 28 and the emitter connected to the ground through resistors R1 and R3 which are connected in series. The collector of the transistor Q1 is connected to a suitable constant voltage source Vcc. Connected at a junction J1 positioned between the resistors R1 and R3 is a base of a transistor Q2 through a resistor R2. The emitter of the transistor Q2 is grounded and the collector thereof leads to a first input terminal 30 of the flip-flop circuit 26. The first voltage detecting circuit 24 comprises a transistor Q3 having the base connected to the input terminal 28 and the collector connected to the constant voltage source Vcc. The emitter of the transistor Q3 is connected to a base of a transistor Q4 through a resistor R4. The emitter of the transistor Q4 is grounded and the collector thereof is connected to the constant voltage source Vcc through a resistor R5 and also to a base of a transistor Q5 through a resistor R6. The emitter of the transistor Q5 is grounded and the collector thereof leads to a second input terminal 32 of the flip-flop circuit 26. The flip-flop circuit 26 comprises a transistor Q6 having the base thereof connected to the input terminal 30, the emitter thereof connected to the ground and the collector connected through a resistor R7 to the constant voltage source Vcc. A transistor Q7, symmetrical to the transistor Q6 has the base connected to the input terminal 32, the emitter connected to the ground and the collector connected to the constant voltage source Vcc through a resistor R9. Connected between the input terminal 30 and the collector of the transistor Q7 is a resistor R10, and connected between the input terminal 32 and the collector of the transistor Q6 is a resistor R8.

It should be noted that the hysteresis circuit 18 as well as other circuits in the receiver unit 2 of the present invention can be formed in a piece of integrated circuit.

In forming the hysteresis circuit 18, the transistors Q1 to Q7, especially transistors Q1 to Q4 are arranged to have the same characteristics, so that each of the transistors Q1 to Q4 would allow a current to flow through from the collector to the emitter, in other words would be brought into conductive state, when the voltage between the base and the emitter reaches a predetermined biasing voltage Vbe. Therefore, in order to put the transistors Q1 and Q2 in the second voltage detecting circuit 22 in conductive state, the input voltage applied to the base of the transistor Q1, must be higher than summed voltage of biasing voltage Vbe for the transistor Q1, voltage drop across the resistors R1 and R2, and biasing voltage Vbe for the transistor Q2. Since the voltage across the resistor R2 is small enough to be omitted, such summed voltage can be expressed as;

$$2Vbe + Vbe \cdot (R1/R3)$$

Likewise, in order to put the transistors Q3 and Q4 in the first voltage detecting circuit 24 in conductive state, the input voltage applied to the base of the transistor Q3 must be higher than summed voltage of biasing voltage $Vbe$ for the transistor Q3, voltage drop across the resistor R4 and biasing voltage $Vbe$ for the transistor Q4. Since the voltage across the resistor R4 is small enough to be omitted, the summed voltage for this case can be expressed as;

$$2Vbe$$

The function of the hysteresis circuit 18 is described hereinbelow.

Assuming that the input voltage V1 supplied to the hysteresis circuit 18 at the input terminal 28 is zero, then the transistor Q1 as well as the transistor Q2 in the second voltage detecting circuit 22 would not allow a current to pass through from the collector to the emitter. In other words, the transistors Q1 and Q2 remain in a non-conductive state, so that the base of the transistor Q6 remains in the high state. Likewise, the transistors Q3 and Q4 in the first voltage detecting circuit 24 remain in the non-conductive state, while the transistor Q5 remains in the conductive state, so that the base of transistor Q7 is held in the low state. As a consequence, a first output terminal 34 and a second output terminal 36 in the flip-flop circuit 26 produces high and low voltage signals, respectively.

When the input voltage V1 increases and reaches the voltage $2Vbe$, then the transistors Q3 and Q4 in the first voltage detecting circuit 24 turn into conductive state, thus the transistor Q5 turns into non-conductive state, and thus the transistor Q6 turns into conductive state. Accordingly, the base of the transistor Q7 connected to the collector of the transistor Q6 through the resistor R8 continuously remains in the same low state as before due to the existence of zero voltage in the collector of the transistor Q6. However, the transistors Q1 and Q2 in the first voltage detecting circuit remain in the non-conductive state, so that the base of the transistor Q6 remains in the high state. Therefore, the conditions at the output terminals 34 and 36 remain in the same conditions as before.

When the input voltage V1 further increases and reaches the voltage $2Vbe + Vbe \cdot (R1/R3)$, then the transistors Q1 and Q2 in the first voltage detecting circuit are turned from non-conductive state to conductive state, so that the base of the transistor Q6 is turned into low state, thus reversing the conditions in the output terminals in the flip-flop circuit 26, that is, the first output terminal 34 produces low voltage signal and the second output terminal 36 produces high voltage signal.

Foregoing description is particularly given during the increase in the input voltage V1. The description hereinbelow is directed when the input voltage V1 decreases.

When the input voltage decreases below the voltage $2Vbe + Vbe \cdot (R1/R3)$, then the transistors Q1 and Q2 in the second voltage detecting circuit 22 are turned into non-conductive state, so that the base of the transistor Q6 turns into high state. However, the conditions in the output terminals in the flip-flop circuit 26 remain in the same condition as before, that is low in the first terminal 34 and high in the second output terminal 36.

When the input voltage further decreases below the voltage $2Vbe$, then the transistors Q3 and Q4 in the first voltage detecting circuit 24 are turned into non-conductive state, so that the base of the transistor Q7 turns into low state. Therefore, the conditions at the output terminals 34 and 36 are changed into high and low conditions, respectively, as shown in FIGS. 4(a) and 4(b).

Figure 4:
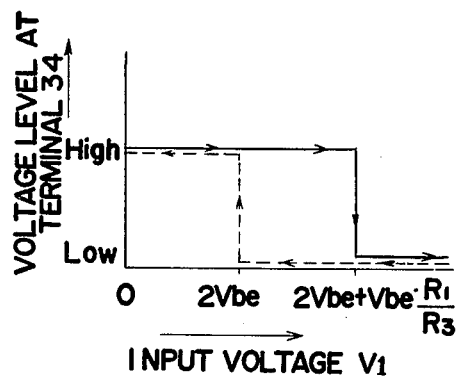
FIGS. 4(a) and 4(b) are graphical representation showing the input-output characteristics of the hysteresis circuit shown in FIG. 3.
Figure 4:
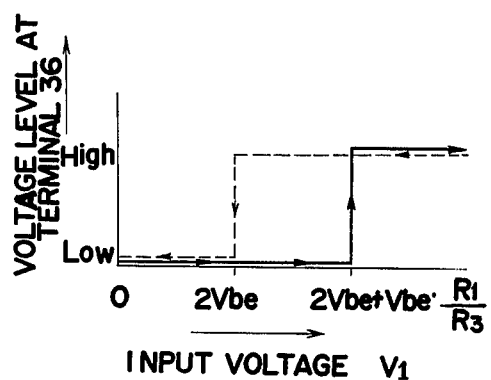

Those changes in the conditions at the output terminals 34 and 36 of the flip-flop circuit 26 is graphically represented in FIGS. 4(a) and 4(b), in which graphs, the abscissa represents the voltage change in the input voltage V1 while the ordinate represents the high and low states at the output terminal of the flip-flop circuit 26.

Referring to FIG. 4(a) there is shown the output characteristics at the terminal 34. During the increase in the input voltage V1, the output voltage remains in high state until the input voltage V1 reaches the voltage $2Vbe + Vbe \cdot (R1/R3)$. When the input voltage becomes larger than the voltage $2Vbe + Vbe \cdot (R1/R3)$, then the output voltage turns from high to low state, as shown in a real line. On the other hand, during the decrease in the input voltage V1, the output voltage at the terminal 34 remains in low state until the input voltage V1 is reduced down to the voltage $2Vbe$. When the input voltage V1 becomes smaller than the voltage $2Vbe$, then the output voltage is turned from low state to high state, as shown in a dotted line.

Such output characteristics, resembling the hysteresis loop, is particularly suitable for producing a stable signal having two distinctive states which are high and low states. In case of employment of the output voltage as shown in FIG. 4(a), the low state in a first level at terminal 34 would positively operate the control element such as a transistor (not shown) to be incorporated in the operator 20, even when the peak value in the input voltage V1 may fluctuate for some degrees.

Since the output characteristics at the terminal 36 is just the opposite to that of the terminal 34, the description therefor is omitted.

It should be noted that the transistors Q1 to Q4 described as formed to have the same characteristics, can be formed to have the different characteristics from each other so as to change the actuating voltage level in the second and the first voltage detection circuits 22 and 24.

Figure 5:
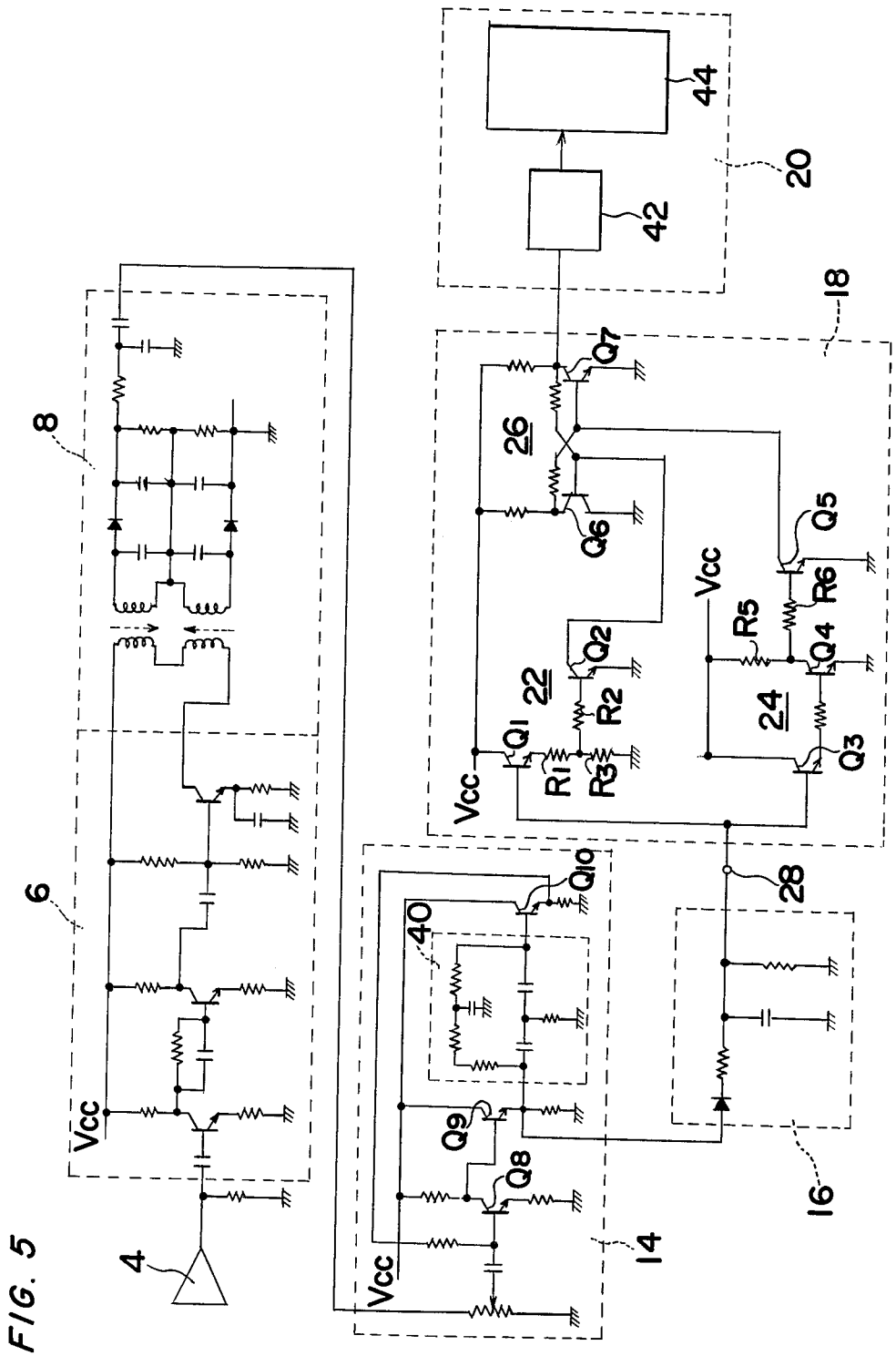
FIG. 5 is a complete circuit diagram of the receiver shown in FIG. 2.

Referring to FIG. 5, there is shown a complete circuit for one embodiment of the receiver unit 2 of the present invention with one series network, particularly suitable for controlling the channel selecting system. Since the circuits for the amplifier 6, FM detector 8, filter 14, and integrator 16 are conventional type of circuits, the detailed description thereof is omitted for the brevity. The filter 14, however, in this embodiment employs active type of filter, so that the description is given functionally, hereinbelow.

The filter 14 shown in FIG. 5 has a transistor Q8 which amplifies the detected signal and a transistor Q9 which feeds the filtered signal to the subsequent ingetrator 16 through the emitter thereof. Also connected to the emitter of the transistor Q9 is an absorption circuit 40 formed by twin-T network having capacitors and resistors. The output of the absorption circuit 40 leads to the base of the transistor Q8 through emitter following transistor Q10, thus forming a negative feed back circuit. If the absorption circuit 40 were designed to absorb the signal having the frequency of 380 Hz, all the signals except the signal having the frequency of 380 Hz are transmitted through the absorption circuit 40 and then fed back to the base of the transistor Q8 with the waveform thereof reversed. The fed back signal including the signal having the frequency of 280 Hz and noise signals affects the original signal to cancel the unnecessary signals. Thus, filtering only the signal having the frequency of 380 Hz.

Still referring to FIG. 5, the operator 20 comprises a shifting pulse generator 42 and a ring counter 44 for changing the channel selecting system upon receipt of signal from the hysteresis circuit 18.

It should be noted that the operator 20 described as provided for selecting the channel can be provided for controlling other devices so long as the device can be controlled with two distinctive signals.

It should also be noted that series networks can be further provided with a set of relay driver and a relay member as in the conventional receiver units so as to operate the tuning device with closing of the relay member.

Since the receiver unit 2 of the present invention incorporates the hysteresis circuit 18, a preferable function in the device to be coupled to the operator 20 can be obtained in high reliability in spite of disadvantageous fluctuations in the controlling signal arriving at the receiver.

Although the present invention has been fully described by way of example with reference to the attached drawings, it is to be noted that various changes and modifications are apparent to those skilled in the art. Therefore, unless otherwise such changes and modifications depart from the scope of the present invention, they should be construed as included therein.

What is claimed is:

1. A remote controller for controlling telecommunication devices having a transmitter unit separately provided for said telecommunication device for producing a carrier sound signal of high frequency carrying a remote control signal and a receiver unit incorporated in said telecommunication device for operating various tuning devices in said telecommunication device upon receipt of said carrier signal from said transmitter, said receiver unit comprising;
    (a) a converter means for converting a received carrier sound signal into an electrical signal;
    (b) a hysteresis circuit connected to said converter means for receiving said electrical signal, said hysteresis circuit comprising means for producing one of a first or second output level signals wherein the first output level signal when the level of the input signal applied to said hysteresis circuit is higher than a second predetermined level which is higher than a first predetermined level and the second output level signal when the level of the input signal applied to the hysteresis circuit is less than the first predetermined level; whereby during an increase of the input signal level to said hysteresis circuit, the output therefrom is maintained at the second output level until the input signal thereto increases above said second predetermined level, and during a decrease of the input signal level to said hysteresis circuit, the output is maintained at the first output level until the input signal thereto decreases below said first predetermined level and
    (c) an operating circuit for operating said tuning device upon receipt of the output signal of said hysteresis circuit.

2. A receiver unit as claimed in claim 1, wherein said tuning device is a channel selecting device incorporated in a television set.

3. A receiver unit as claimed in claim 1, wherein said tuning device is a power switch and volume control for controlling the loudness of the sound to be reproduced in a television set.

4. A receiver unit as claimed in claim 1, wherein said first output level signal actuates said operating circuit to initiate operation of said tuning device.

5. A receiver unit as claimed in claim 1, wherein said second output level signal actuates said operating circuit to initiate operation of said tuning device.

6. A receiver unit as claimed in claim 1, wherein said hysteresis circuit comprises;
    (a) a first voltage detecting circuit for detecting when the level of said input signal exceeds said first predetermined input level;
    (b) a second voltage detecting circuit for detecting when the level of said input signal exceeds said second predetermined input level; and
    (c) a flip-flop circuit coupled to said first and second voltage detecting circuits for producing said first and second output level signals.

7. A receiver unit as claimed in claim 6, wherein said first and second voltage detecting circuits include transistors and/or resistors wherein said first and second input levels are determined by the voltage drop between the base and emitter of said transistors and/or by the voltage drop across said resistors.

8. A receiver unit as claimed in claim 6, wherein said second voltage detecting circuit comprises;
    (a) a first transistor having the base connected to said converter for receiving said input signal;
    (b) a first resistor connected to the emitter of said first transistor;
    (c) a second resistor having one end connected to said first resistor, and the other end grounded; and
    (d) a second transistor having the base connected to said one end of the second resistor, the emitter thereof being grounded and the collector being connected to said flip-flop circuit whereby said second output level established in said second voltage detecting circuit is equal to the summed voltage of voltage drop produced between the base and emitter of said first and second transistors and the voltage drop across said first resistor.

9. A receiver unit as claimed in claim 6, wherein said second voltage detecting circuit comprises;
    (a) a first transistor having the base connected to said converter for receiving said input signal;
    (b) a first resistor connected to the emitter of said first transistor;
    (c) a second resistor having one end connected to said third resistor, and the other end grounded; and
    (d) a second transistor having the base connected to said one end of the second resistor, the emitter thereof being grounded and the collector being connected to said flip-flop circuit whereby said second output level established in said second voltage detecting circuit is equal to summed voltage of the voltage drop produced between base and emitter of said first and second transistors and the voltage drop across said first resistor, and wherein said first voltage detecting circuit comprises;
    a third transistor having the base connected to said converter for receiving said first electrical signal; and a fourth transistor having the base connected to the emitter of said third transistor, the emitter being connected to the ground, whereby said first level established in said second voltage detecting circuit is equal to summed voltage of voltage drops produced between the base and emitter of said third and fourth transistors.

10. A receiver unit as claimed in claim 9 further comprising a fifth transistor having the base connected to the collector of said fourth transistor, the emitter connected to the ground and the collector connected to said flip-flop circuit.

11. A receiver unit as claimed in claim 6 further comprising a relay driver connected to said hysteresis circuit.

12. A receiver unit as claimed in claim 6 wherein said first electrical signal has a D.C. level.

13. A receiver unit as claimed in claim 6 wherein said sound signal produced from said transmitter is in a form of an FM signal.

14. A receiver unit as claimed in claim 13 further comprising;
(a) an FM detecting circuit connected to said converter means for detecting a particular FM signal in said first electrical signal and for producing a demodulated signal; and
(b) an integrator circuit connected to said FM detecting circuit for integrating said demodulated signal whereby said demodulated signal having A.C. power is changed into an integrated signal having a D.C. level.

* * * * *